US009502629B2

(12) United States Patent
Takahashi

(10) Patent No.: US 9,502,629 B2
(45) Date of Patent: Nov. 22, 2016

(54) THERMOELECTRIC CONVERSION ELEMENT AND THERMOELECTRIC CONVERSION MATERIAL

(71) Applicant: FUJIFILM Corporation, Minato-ku, Tokyo (JP)

(72) Inventor: Eri Takahashi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 118 days.

(21) Appl. No.: 14/579,576

(22) Filed: Dec. 22, 2014

(65) Prior Publication Data

US 2015/0107638 A1 Apr. 23, 2015

Related U.S. Application Data

(63) Continuation of application No. PCT/JP2013/068018, filed on Jul. 1, 2013.

(30) Foreign Application Priority Data

Jul. 11, 2012 (JP) .................................. 2012-155983
Jun. 25, 2013 (JP) .................................. 2013-132804

(51) Int. Cl.
| | | |
|---|---|---|
| H01L 35/24 | (2006.01) |
| H01L 35/22 | (2006.01) |
| H01L 35/32 | (2006.01) |
| H01L 35/34 | (2006.01) |
| C08L 101/12 | (2006.01) |
| C08G 75/32 | (2006.01) |
| C07C 211/48 | (2006.01) |
| C08L 3/04 | (2006.01) |
| B82Y 30/00 | (2011.01) |
| C08K 7/00 | (2006.01) |
| C08L 65/00 | (2006.01) |
| C08L 101/00 | (2006.01) |
| C08G 61/12 | (2006.01) |
| C08K 7/24 | (2006.01) |
| C08K 7/06 | (2006.01) |

(52) U.S. Cl.
CPC .............. *H01L 35/24* (2013.01); *B82Y 30/00* (2013.01); *C08G 61/126* (2013.01); *C08K 7/00* (2013.01); *C08L 65/00* (2013.01); *C08L 101/00* (2013.01); *H01L 35/22* (2013.01); *C08G 2261/3223* (2013.01); *C08G 2261/55* (2013.01); *C08K 7/06* (2013.01); *C08K 7/24* (2013.01)

(58) Field of Classification Search
None
See application file for complete search history.

(56) References Cited

U.S. PATENT DOCUMENTS

| | | | | |
|---|---|---|---|---|
| 8,802,964 B2* | 8/2014 | Meng | ..................... | B82Y 30/00 136/205 |
| 8,829,327 B2* | 9/2014 | Meng | ..................... | B82Y 30/00 136/205 |
| 2010/0179469 A1 | 7/2010 | Hammond et al. | | |
| 2010/0252780 A1 | 10/2010 | Hiroshige et al. | | |
| 2010/0319745 A1 | 12/2010 | Meng et al. | | |
| 2010/0319750 A1 | 12/2010 | Meng et al. | | |
| 2012/0133210 A1* | 5/2012 | Moon | ..................... | H01L 35/00 307/80 |
| 2014/0100352 A1 | 4/2014 | Tanaka et al. | | |
| 2014/0251407 A1* | 9/2014 | Nishio | ..................... | H01L 35/24 136/239 |

FOREIGN PATENT DOCUMENTS

| | | | |
|---|---|---|---|
| CN | 101803051 A | | 8/2010 |
| CN | 101931043 A | | 12/2010 |
| CN | 102593342 A | * | 7/2012 |
| JP | 2004-87714 A | | 3/2004 |
| JP | 2006312673 A | | 11/2006 |
| JP | 2007076998 A | | 3/2007 |
| JP | 2008-305831 A | | 12/2008 |
| JP | 2010-199276 A | | 9/2010 |
| JP | 2012119657 A | | 6/2012 |
| JP | 2012514498 A | | 6/2012 |
| KR | 2011048821 A | * | 11/2009 |
| WO | 2008062892 A1 | | 5/2008 |

OTHER PUBLICATIONS

Bounioux et al. Environmental Science (2013) 6(3), 918-925.*
Y. Du, et al., "Preparation and characterization of multiwalled carbon nanotube/poly (3-hexylthiophene) thermoelectric composite materials", Synthetic Metals, Jan. 21, 2012, pp. 375-380, vol. 162, Issues 34.
International Search Report for PCT/JP2013/068018 dated Sep. 17, 2013 [PCT/ISA/210], 2 pages in English.
(Continued)

*Primary Examiner* — Nyeemah A Grazier
(74) *Attorney, Agent, or Firm* — Sughrue Mion, PLLC

(57) ABSTRACT

In a thermoelectric conversion element comprising a thermoelectric conversion layer formed by using a thermoelectric conversion material, the thermoelectric conversion material includes a polythiophene polymer, which includes a main chain made of a repeating unit represented by the following formula (1), and has a side chain R in a regiorandom array with respect to the main chain, a carbon nanotube, and a non-conjugated macromolecule.

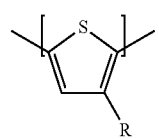

Formula (1)

In Formula (1), R represents an alkyl group having 1 to 20 carbon atoms.

10 Claims, 2 Drawing Sheets

(56) References Cited

OTHER PUBLICATIONS

Written Opinion for PCT/JP2013/068018 dated Sep. 17, 2013 [PCT/ISA/237].
Notice of Reasons for Rejection, mailed Jun. 23, 2015, issued in corresponding JP Application No. 2013-132804, 15 pages in English and Japanese.

International Preliminary Report on Patentability and Written Opinion, dated Jan. 13, 2015, issued in corresponding International Application No. PCT/JP2013/068018, 8 pages in English and Japanese.
Communication, dated Jun. 3, 2016, from the State Intellectual Property Office of the P.R.C., in counterpart Chinese application No. 201380029291.0.

* cited by examiner

THERMOELECTRIC CONVERSION ELEMENT AND THERMOELECTRIC CONVERSION MATERIAL

CROSS-REFERENCE TO RELATED APPLICATIONS

This application is a Continuation of PCT International Application No. PCT/JP2013/068018 filed on Jul. 1, 2013, which claims priority under 35 U.S.C §119(a) to Japanese Patent Application No. 2012-155983 filed on Jul. 11, 2012 and Japanese Patent Application No. 2013-132804 filed on Jun. 25, 2013. Each of the above application(s) is hereby expressly incorporated by reference, in its entirety, into the present application.

BACKGROUND OF THE INVENTION

1. Field of the Invention

The present invention relates to a thermoelectric conversion element and a thermoelectric conversion material used in the same element.

2. Description of the Related Art

In recent years, in consideration of the global environment, there has been a demand for the transition of fossil energies of the related art into renewable energies. Examples of the renewable energies include solar power generation, wind power generation, wave power generation, vibration power generation, thermoelectric power generation, and the like, however, among the above-described power generations, the thermoelectric power generation is attracting attention since the thermoelectric power generation is capable of directly converting thermal energy into electric power, and is capable of effectively using a huge quantity of unused thermal energy such as exhaust heat from solar power generation, geothermal power generation, hot water heat power generation, an industrial furnace or a vehicle. In addition, the thermoelectric power generation is capable of directly converting thermal energy into electric power, and does not require a movable unit, and thus has been put into practical use of a wrist watch which is operated by using body heat, a power supply in a remote area, a power supply in the space, and the like.

For the thermoelectric power generation, a thermoelectric conversion material capable of converting thermal energy into electric energy and vice versa, and a thermoelectric conversion element (thermoelectric power generation element) produced by processing the thermoelectric conversion material are used. From the viewpoint of the thermoelectric conversion efficiency, the thermoelectric conversion material that has been put into practical use at the moment is an inorganic material, but the inorganic material has problems of a high price, the inclusion of a harmful substance, the complicated step of being processed into a thermoelectric conversion element, and the like. Therefore, studies are underway regarding an organic thermoelectric conversion material that can be manufactured at a relatively low cost, and can be easily formed into a film. For example, US2010/0319750A and JP2008-3050831A report thermoelectric conversion materials for which a carbon nanotube is used.

SUMMARY OF THE INVENTION

An object of the present invention is to provide a thermoelectric conversion element that has a strong electric conduction property and a thermoelectric force required for thermoelectric conversion, and exhibits excellent thermoelectric performance, and a thermoelectric conversion material that is used for the same element.

The present inventors have intensively studied regarding a thermoelectric conversion element for which an organic thermoelectric conversion material is used. As a result, it has been found that a composition including a carbon nanotube (hereinafter, in some cases, referred to as CNT), a regiorandom-type polythiophene polymer, and a non-conjugated macromolecule has excellent CNT-dispersing properties and film-forming properties, exhibits high thermoelectric performance, and is useful as a thermoelectric conversion material. In addition, a thermoelectric conversion element produced using the above-described composition has a strong electric conduction property and a thermoelectric force required for thermoelectric conversion, and exhibits excellent thermoelectric performance. The present invention has been completed on the basis of the above-described finding.

That is, the above-described object is achieved by the following means.

<1> A thermoelectric conversion element comprising a thermoelectric conversion layer formed by using a thermoelectric conversion material, in which the thermoelectric conversion material includes a polythiophene polymer, which includes a main chain made of a repeating unit represented by the following formula (I), and has a side chain R in a regiorandom array with respect to the main chain, a carbon nanotube, and a non-conjugated macromolecule.

[Chem. 1]

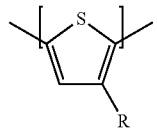

Formula (1)

(In Formula (1), R represents an alkyl group having 1 to 20 carbon atoms.)

<2> The thermoelectric conversion element according to <1> in which a proportion of head to tail (HT) bonds in the polythiophene polymer is less than 95%.

<3> The thermoelectric conversion element according to <1> or <2> in which, in Formula (1), R represents an alkyl group having 4 to 12 carbon atoms.

<4> The thermoelectric conversion element according to any one of <1> to <3> in which, in Formula (1), R represents a branched alkyl group.

<5> The thermoelectric conversion element according to any one of <1> to <4> in which, in Formula (1), R represents a 2-ethyl hexyl group.

<6> The thermoelectric conversion element according to any one of <1> to <5> in which a concentration of metal impurities containing in the polythiophene polymer is 1000 ppm or less, and the metal impurities contain at least one metal selected from Fe, Zn, and Ni.

<7> The thermoelectric conversion element according to any one of <1> to <6> in which, in a total solid content of the thermoelectric conversion material, a content of the carbon nanotube is in a range of 10 mass % to 60 mass %, and a content ratio between the polythiophene polymer and the carbon nanotube is in a range of 1:4 to 4:1.

<8> The thermoelectric conversion element according to any one of <1> to <7> including a base material and a pair of electrodes on the base material, in which the thermoelectric conversion layer is disposed between the electrodes.

<9> A thermoelectric conversion material including a polythiophene polymer, which includes a main chain made of a repeating unit represented by the following formula (I), and has a side chain R in a regiorandom array with respect to the main chain, a carbon nanotube, and a non-conjugated macromolecule.

<10> The thermoelectric conversion material according to <9> including a solvent.

[Chem. 2]

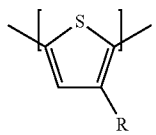

Formula (1)

(In Formula (1), R represents an alkyl group having 1 to 20 carbon atoms.)

In the present invention, a numerical value range expressed using "to" indicates a range including the numerical values before and after the "to" as the lower limit value and the upper limit value.

In addition, in the present invention, when a substituent is called an xxx group, the xxx group may include an arbitrary substituent. Furthermore, in a case in which there is a plurality of groups expressed using the same symbol, the groups may be mutually identical or different.

The thermoelectric conversion material of the present invention and the thermoelectric conversion element for which the thermoelectric conversion material is used have a strong electric conduction property and a thermoelectric force required for thermoelectric conversion, and has excellent thermoelectric performance.

DESCRIPTION OF THE PREFERRED EMBODIMENTS

Figure 1:
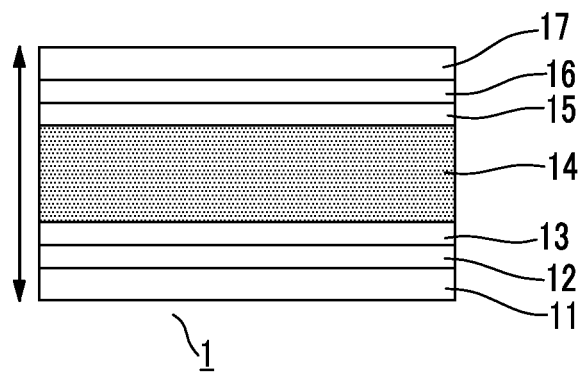
FIG. 1 is a view schematically illustrating an example of a thermoelectric conversion element of the present invention. The arrow in FIG. 1 indicates the direction of a temperature difference imparted during the use of the element.

For a thermoelectric conversion element of the present invention, a thermoelectric conversion material including a polythiophene polymer having a specific structure, a carbon nanotube, and a non-conjugated macromolecule is used for a thermoelectric conversion layer.

First, a thermoelectric conversion material used in the present invention, and components thereof will be described.

[Thermoelectric Conversion Material]

The thermoelectric performance of the thermoelectric conversion material or the thermoelectric conversion element can be measured using a performance index ZT expressed using the following equation (A). As is clear from the following equation (A), the improvement of the thermoelectric performance requires an increase in the thermoelectric force and the electric conductivity and a decrease in the thermal conductivity. As described above, since the thermoelectric performance is significantly affected by factors other than the electric conductivity, it is not certain whether or not a material generally having a high electric conductivity effectively functions as a thermoelectric conversion material in actual cases. The thermoelectric conversion material of the present invention is capable of realizing a high electric conductivity without decreasing the thermoelectric force as verified in examples described below, and has thermoelectric performance favorable enough to be used as a thermoelectric conversion material.

$$\text{Performance index } ZT = S^2 \cdot \sigma \cdot T/\kappa \qquad (A)$$

S (V/K): Thermoelectric force (Seebeck coefficient)
σ (S/m): Electric conductivity
κ (W/mK): Thermal conductivity
T (K): Absolute temperature

[Carbon Nanotube]

Examples of the carbon nanotube (CNT) include a single-layer CNT around which a carbon film (graphene sheet) is cylindrically coiled, a dual-layer CNT around which two graphene sheets are concentrically coiled, and a multi-layer CNT around which multiple graphene sheets are concentrically coiled. In the present invention, the single-layer CNT, the dual-layer CNT, and the multi-layer CNT may be singly used, or two or more CNTs may be jointly used. In particular, it is preferable to use the single-layer CNT and the dual-layer CNT which have excellent electric conductivity and semiconductor characteristics, and the single-layer CNT is more preferably used.

The single-layer CNT may be a semi-conductive CNT or a metallic CNT, or may be a combination of a semi-conductive CNT and a metallic CNT. In addition, the CNT may include metal or the like, or may include a molecule such as fullerene. Meanwhile, the thermoelectric conversion material of the present invention may include, in addition to the CNT, nanocarbons such as carbon nanohorns, carbon nanocoils, or carbon nanobeads.

The CNT can be manufactured using an arc discharge method, a chemical vapor deposition method (hereinafter, referred to as the CVD method), a laser abrasion method, or the like. The CNT used in the present invention may be a CNT obtained using any method, but is preferably a CNT obtained using the arc discharge method and the CVD method.

When the CNT is manufactured, fullerene, graphite, or amorphous carbon is generated as a by-product at the same time, and catalyst metals such as nickel, iron, cobalt, and yttrium also remain. To remove these impurities, it is preferable to purify the CNT. There is no particular limitation regarding the method for purifying the CNT, but an acid treatment using nitric acid, sulfuric acid, or the like or an ultrasonic treatment is effective for removing the impurities. It is more preferable to remove the impurities by separation using a filter in conjunction with the above-described treatment from the viewpoint of improving the purity.

After the purification, the obtained CNT can be used with no additional step. In addition, generally, the CNT is generated in a string shape, the CNT may be used after being cut into a desired length depending on usage. The CNT can be cut into a short fiber shape using an acid treatment in which nitric acid, sulfuric acid, or the like is used, an ultrasonic treatment, a frost shattering method, or the like. In addition, it is preferable to carry out separation using a filter in conjunction with the above-described treatment from the viewpoint of improving the purity.

In the present invention, not only the cut CNT but also the CNT that has been produced in a short fiber shape in advance can be used. The above-described short fiber-shaped CNT is obtained in a shape of being oriented in the vertical direction to the substrate surface by, for example, forming catalyst metals such as iron and cobalt on a substrate, and thermally decomposing a carbon compound on the substrate surface at 700° C. to 900° C. using the CVD method, thereby causing the vapor deposition of the CNT. The short fiber-shaped CNT produced in the above-described manner can be taken out from the substrate using a method such as peeling. In addition, the short fiber-shaped CNT can also be grown on the surface of a catalyst metal using the CVD method after the catalyst metal is supported on a porous supporting body such as porous silicon or on an anodically-oxidized film of alumina. The oriented short fiber-shaped CNT can be produced using a method in which molecules such as iron phthalocyanine containing a catalyst metal in the molecules is used as a raw material, and CVD is carried out in a gas flow of argon/hydrogen, thereby producing the CNT on the substrate. Furthermore, it is also possible to obtain the oriented short fiber-shaped CNT on the surface of a SiC monocrystal using an epitaxial growth method.

The average length of the CNT used in the present invention is not particularly limited; however, from the viewpoint of manufacturing readiness, film-forming properties, electric conduction properties, and the like, the average length of the CNT is preferably in a range of 0.01 µm to 1000 µm, and more preferably in a range of 0.1 µm to 100 µm.

The diameter of the CNT used in the present invention is not particularly limited; however, from the viewpoint of durability, transparency, film-forming properties, electric conduction properties, and the like, the diameter of the CNT is preferably in a range of 0.4 nm to 100 nm, more preferably 50 nm or less, and still more preferably 15 nm or less.

The content of the CNT in the thermoelectric conversion material is, in the total solid content, preferably in a range of 10 mass % to 60 mass %, more preferably in a range of 10 mass % to 50 mass %, and particularly preferably in a range of 20 mass % to 50 mass %. As described in the examples described below, the thermoelectric conversion material of the present invention has excellent CNT-dispersing properties, and favorable film-forming properties can be obtained even when the content of the CNT is high.

[Polythiophene Polymer]

The polythiophene polymer used in the thermoelectric conversion material is a polymer having an alkyl-substituted thiophene structure represented by the following formula (I) as a repeating unit and including a main chain made of the repeating unit, and is a polythiophene polymer having a side chain R of the polymer in a regiorandom array with respect to the main chain of the polymer. The polythiophene polymer has a molecular structure of a conjugate system, and functions as an electrically conductive macromolecule.

[Chem. 3]

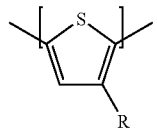

Formula (1)

In Formula (1), R represents an alkyl group having 1 to 20 carbon atoms.

R may be either a straight alkyl group or a branched alkyl group. Specific examples of the straight alkyl group include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, and an eicosyl group, and specific examples of the branched alkyl group include an isopropyl group, an isobutyl group, a s-butyl group, a t-butyl group, a 2-ethyl hexyl group, a 2-methyl butyl group, a 2-methyl hexyl group, a 2-ethyl octyl group, and the like. The alkyl group may further include a substituent, but is preferably an unsubstituted alkyl group.

The number of carbon atoms in R is preferably in a range of 4 to 12.

Furthermore, R is preferably a branched alkyl group, more preferably a branched alkyl group having 4 to 12 carbon atoms, still more preferably a 2-ethyl hexyl group, a 2-methylbutyl group, a 2-methyl hexyl group, or a 2-ethyl octyl group, and particularly preferably a 2-ethyl hexyl group. As described in the examples described below, when a branched alkyl group is introduced as R, the solubility of the polythiophene polymer and the dispersibility of the CNT in the thermoelectric conversion material are improved, and thus favorable film-forming properties can be obtained.

Since the repeating unit represented by Formula (1) is a non-symmetrical structure having the alkyl group R in the third position of a thiophene ring, when the repeating units are bonded with each other, a poly-alkyl-substituted thiophene obtained by polymerizing the repeating units becomes anisotropic due to the orientations of bonds at the second and fifth positions of the respective thiophene rings. That is, the repeating units represented by Formula (1) are capable of producing three bond types of a bond in which the second positions of the thiophene rings are bonded with each other (HH bond: head-to-head), a bond in which the second position and the fifth position are bonded with each other (HT bond: head-to-tail), and a bond in which the fifth positions are bonded with each other (TT bond: tail-to-tail).

In a case in which the polymer is constituted only of the HT bonds, side chains (substituents in the third positions) are regularly arrayed with respect to the polymer main chain. A polymer constituted only of the above-described HT bonds is said to have a regioregular array. On the contrary, in a case in which the HT bonds, the HH bonds, and the TT bonds of the repeating units are present together in the polymer, side chains are irregularly arrayed with respect to the polymer main chain. A polymer having a bond type other than the above-described HT bond is said to have a regiorandom array. The proportion of the above-described bond types in the polymer can be measured using the nuclear magnetic resonance spectrometry ($^1$H-NMR).

Among the polythiophene polymers that can be obtained by polymerizing the repeating units represented by Formula (1), in the present invention, the regiorandom-type polythiophene polymer in which the side chains R of the polymer are in a regiorandom array with respect to the polymer main chain is used. Whether or not the polythiophene polymer is the regiorandom type can be confirmed by measuring the ratio (%) of the HT (head to tail) bonds to the total bond number, which is considered to be 100%, in the bonds of the repeating units in the polymer. The ratio of the HT bonds can be determined by analyzing the location (in a range of 2 ppm to 4 ppm) of the chemical shift of a hydrogen atom on a carbon atom directly bonded with the thiophene ring among the Rs bonded with the thiophene rings using $^1$H-NMR.

Specifically, since, in the case of a HT structure, for example, an n-propyl group, a triplet signal is observed for a proton on a carbon atom directly bonded with the thiophene ring, that is, methylene proton, and, in the case of a HH structure, a multiplet signal is observed on a higher magnetic field side of the signal corresponding to the HT structure for the methylene proton, and the HT bond ratio can be determined by comparing the integral values of the above-described signals. In the present invention, values measured by the above-described method are used as the HT bond ratio.

In the present invention, the ratio of the HT bonds in the polythiophene polymer is preferably less than 95%, more preferably 90% or less, and particularly preferably 80% or less. The lower limit value of the HT bond ratio is not particularly limited, but is, practically, 60% or more.

It is known that, in the polythiophene-based compound, the difference in the bond type between constituent monomers affects the electric conduction properties of the polymer or other properties. Generally, as the ratio of the HT bonds in the polythiophene-based compound increases, the flatness of the polymer main chain improves, and the π-π stacking structure between the polymers are more easily formed, and therefore the migration of charges become easier, which is preferable. Therefore, thus far, it has been a common technical knowledge that the regioregular-type polymer is preferably used to improve the properties including electric conduction properties. The above-described patent documents, JP2008-238162A and JP2005-268582A are also intended for desired performance improvement through the selective use of the regioregular-type polythiophene compound.

On the contrary, in the present invention, instead of the regioregular-type polythiopene that has been considered to be preferable in the related art, the regiorandom-type polythiophene is used as an essential component of the composition. As verified in the examples described below, when the regiorandom-type polythiophene polymer is blended together with the CNT, the solubility of the polythiophene in the composition is improved, and the dispersibility of the CNT is also improved. The above-described effect stands out particularly when the side chain R is a branched alkyl group.

In the polythiophene polymer used in the present invention, the repetition number of the repeating units represented by Formula (1) is preferably in a range of approximately 4 to 2000. In addition, the molecular weight is, in terms of the weight-average molecular weight, preferably in a range of 5000 to 250,000, more preferably in a range of 10,000 to 200,000, and still more preferably in a range of 15,000 to 170,000. The weight-average molecular weight can be measured using gel permeation chromatography (GPC).

As the polythiophene polymer used in the present invention, a commercially available product can be used, or a polythiophene polymer can be synthesized by polymerizing raw material monomers through oxidation polymerization in which an oxidant is added.

The content of the polythiophene polymer in the thermoelectric conversion material is, in the total solid content, preferably in a range of 1 mass % to 40 mass %, more preferably in a range of 5 mass % to 40 mass %, still more preferably in a range of 5 mass % to 30 mass %, and particularly preferably in a range of 10 mass % to 30 mass %.

In addition, the content ratio (polythiophene polymer: CNT) between the polythiophene polymer and the CNT in the solid content of the thermoelectric conversion material is, by mass, preferably in a range of 1:4 to 4:1, and more preferably in a range of 1:4 to 3:1. When the content ratio between the polythiophene polymer and the carbon nanotube in the thermoelectric conversion material is within the above-described range, a thermoelectric conversion material being excellent in terms of both the solubility of the polythiophene polymer and the dispersibility of the CNT can be obtained, and consequently, favorable film-forming properties can be realized, which is preferable.

Generally, a metal catalyst is used in the polymerization reaction of a monomer, and therefore it is common for a synthesized polymer to contain metal impurities derived from the catalyst. In the polythiophene polymer used in the present invention, the concentration of impurities is, by mass, preferably 1000 ppm or less. Here, the impurities refer to metal impurities including at least one metal selected from Fe, Zn, and Ni. The impurities may contain metal elements or ions of Fe, Zn, and Ni, compounds or complexes containing Fe, Zn, and Ni, and the like. The metal impurities may contain metals other than Fe, Zn, and Ni.

The concentration of the metal impurities in the polythiophene polymer is preferably 1000 ppm or less since the solubility of polythiophene in the composition is improved. The concentration of the metal impurities is more preferably 900 ppm or less, and still more preferably 800 ppm or less. The lower limit value of the concentration of the impurities is preferably lower, and the impurities are preferably not contained, but the practical lower limit value is 200 ppm or more. The concentration of the metal impurities in the polythiophene can be obtained by measuring the ash component using inductively coupled plasma mass spectrometry after polythiophene is heated and decomposed, and, in the present invention, the measured values are used.

Examples of a method for reducing the concentration of the impurities in the polythiophene polymer include the filtration or water-washing of a product solution obtained after a re-precipitation treatment or a polymerization reaction, washing using a metal chelating agent-containing aqueous solution, the washing of the polymer using a Soxhlet extraction method, and the like.

[Non-Conjugated Macromolecule]

The non-conjugated macromolecule used in the thermoelectric conversion material is a macromolecular compound having a conjugated structure with a polymer main chain and exhibiting no electric conduction properties. Specifically, the non-conjugated macromolecule is a macromolecule other than a macromolecule in which the polymer main chain is constituted of an aromatic ring (a carbon ring-based aromatic ring or a hetero aromatic ring), a ring, a group, or an atom selected from hetero atoms having an ethynylene bond, an ethenylene bond, and a lone electron pair.

In the present invention, an ordinarily-known non-conjugated macromolecule can be used with no particular limitation regarding the type thereof as long as the non-conjugated macromolecule satisfies the above-described conditions. Preferably, a macromolecular compound obtained by polymerizing a compound selected from a group consisting of a vinyl compound, a (meth)acrylate compound, a carbonate compound, an ester compound, an amid compound, an imide compound, a fluorine compound, and a siloxane compound is used.

Specific examples of the vinyl compound include vinyl arylamines such as styrene, vinyl pyrrolidone, vinylcarbazole, vinylpyridine, vinylnaphthalene, vinylphenol, vinyl acetate, styrenesulfonic acid, vinyl alcohol, and vinyl triphenylamine; vinyl trialkylamines such as vinyl tributylamine; and the like.

Specific examples of the (meth)acrylate compound include alkyl group-containing hydrophobic acrylates such as methyl acrylate, ethyl acrylate, propyl acrylate, and butyl acylate; acrylate-based monomers such as hydroxyl group-containing acrylates such as 2-hydroxyethyl acrylate, 1-hydroyethyl acrylate, 2-hydroxypropyl acrylate, 3-hydroxypropyle acrylate, 1-hydroxypropyl acrylate, 4-hydroxybutyl acrylate, 3-hydroxybutyl acrylate, 2-hydroxybutyl acrylate, and 1-hydroxybutyl acrylate; methacrylate-based monomers in which an acryloyl group in the above-described monomer is substituted by a methacryloyl group; and the like.

Specific examples of the polymer obtained by polymerizing the carbonate compound include general-purpose polycarbonate constituted of bisphenol A and phosgene, LUPIZETA (trade name, manufactured by Mitsubishi Gas Chemical Company, Inc.), PANLITE (trade name, manufactured by Teijin Chemicals Ltd.), and the like.

Specific examples of the ester compound include lactic acid. In addition, specific examples of the polymer obtained by polymerizing the ester compound include VYLON (trade name, manufactured by Toyobo Co., Ltd.), and the like.

Specific examples of the polymer obtained by polymerizing the amide compound include PA-100 (trade name, manufactured by T&K TOKA Corporation) and the like.

Specific examples of the polymer obtained by polymerizing the imide compound include SOLPIT 6,6-PI (trade name, manufactured by Solpit Industries, Ltd.) and the like.

Specific examples of the fluorine compound include vinylidene fluoride, vinyl fluoride, and the like.

Specific examples of the siloxane compound include diphenyl siloxane, phenyl methyl siloxane, and the like.

The non-conjugated macromolecule may be a homopolymer or a copolymer.

In the present invention, a macromolecular compound obtained by polymerizing the vinyl compound is more preferably used as the non-conjugated macromolecule.

The content of the non-conjugated macromolecule in the thermoelectric conversion material is preferably in a range of 10 parts by mass to 1500 parts by mass, more preferably in a range of 30 parts by mass to 1200 parts by mass, and particularly preferably in a range of 80 parts by mass to 1000 parts by mass with respect to 100 parts by mass of the polythiophene polymer.

The non-conjugated macromolecule is preferably hydrophobic, and more preferably includes no hydrophilic group such as sulfonic acid or hydroxyl group in the molecules. In addition, the non-conjugated macromolecule preferably has a solubility parameter (SP value) of 11 or less. The non-conjugated macromolecule having an SP value of 11 or less is preferably a polyvinyl compound such as polystyrene, polyvinyl naphthalene, or polyvinyl acetate, a poly(meth) acrylate such as polymethyl acrylate, ethyl acrylate, propyl acrylate, or butyl acrylate, a polyester compound, polycarbonate, polyvinylidene fluoride, or the like, and is more preferably polystyrene, polyvinyl naphthalene, polymethyl acrylate, or polycarbonate.

The concentration of the total solid content obtained by summing the concentrations of individual solid contents of the CNT, the polythiophene polymer, and the non-conjugated macromolecule in the total amount of the thermoelectric conversion material is preferably in a range of 3 mass % to 20 mass %, and more preferably in a range of 4 mass % to 15 mass %. The thermoelectric conversion material of the present invention is excellent in terms of the CNT-dispersing properties, and is capable of obtaining favorable film-forming properties even in a case in which the concentration of the solid content in the material is high.

[Solvent]

The thermoelectric conversion material of the present invention preferably includes a solvent in addition to the above-described CNT, polythiophene polymer, and non-conjugated macromolecule. The thermoelectric conversion material of the present invention is more preferably a CNT-dispersed solution including a polythiophene component dissolved in the solvent and CNT dispersed therein.

The solvent is preferably capable of favorably dispersing or dissolving the respective components, and water, an organic solvent, or a mixed solvent thereof can be used. The solvent is preferably an organic solvent. Preferable examples thereof include a halogen-based solvent such as an alcohol or chloroform; an aprotic polar solvent such as DMF, NMP, or DMSO; an aromatic solvent such as chlorobenzene, dichlorobenzene, benzene, toluene, xylene, mesitylene, tetralin, tetramethylbenzene, or pyridine; a ketone-based solvent such as cyclohexanone, acetone, or methyl ethyl ketone; an ether-based solvent such as diethyl ether, THF, t-butyl methyl ether, dimethoxy ethane, or diglyme; and the like. More preferable examples thereof include a halogen-based solvent such as chloroform; an aprotic polar solvent such as DMF or NMP; an aromatic solvent such as dichlorobenzene, xylene, mesitylene, tetralin, or tetramethylbenzene; an ether-based solvent such as THF; and the like.

In addition, the solvent is preferably deaerated in advance. The concentration of dissolved oxygen in the solvent is preferably set to 10 ppm or less. Examples of a deaerating method include a method in which an ultrasonic wave is radiated at a reduced pressure, a method in which an inert gas such as argon is bubbled, and the like.

Furthermore, the solvent is preferably dehydrated in advance. The amount of moisture in the solvent is preferably set to 1000 ppm or less, and more preferably set to 100 ppm or less. As a method for dehydration, a well-known method such as a method in which a molecular sieve is used, or distillation can be used.

The amount of the solvent in the thermoelectric conversion material is preferably in a range of 90 mass % to 99.5 mass %, more preferably in a range of 90 mass % to 97 mass %, and still more preferably in a range of 92.5 mass % to 96 mass % with respect to the total amount of the thermoelectric conversion material.

[Dopant]

The thermoelectric conversion material of the present invention may appropriately include a dopant. The dopant is a compound that is doped into the polythiophene polymer which is an electrically conductive macromolecule, and needs to be capable of doping polythiophene with a positive charge (p-type doping) by protonating polythiophene or removing an electron from the $\pi$ conjugate system of polythiophene. Specifically, it is possible to use an onium salt compound, an oxidant, an acidic compound, an electron acceptor compound, or the like, which will be described below.

1. Onium Salt Compound

The onium salt compound used as the dopant is preferably a compound generating an acid through the supply of energy, such as the radiation of an active energy ray (a radioactive ray, an electromagnetic wave, or the like) or the supply of heat (an acid-generating agent or an acid precursor). Examples of the onium salt compound include a sulfonium salt, an iodonium salt, an ammonium salt, a carbonium salt, a phosphonium salt, and the like. Among the above-described onium salt compounds, a sulfonium salt, an iodonium salt, an ammonium salt, and a carbonium salt are preferable, a sulfonium salt, an iodonium salt, and a carbonium salt are more preferable, and a sulfonium salt and an iodonium salt are particularly preferable. Examples of an anion part constituting the salt include the counter anion of a strong acid.

2. Oxidant, Acidic Compound, and Electron Acceptor Compound

Examples of the oxidant used as the dopant in the present invention include halogens ($Cl_2$, $Br_2$, $I_2$, ICl, $ICl_3$, IBr, and IF), Lewis acids ($PF_5$, $AsF_5$, $SbF_5$, $BF_3$, $BCl_3$, $BBr_3$, and $SO_3$), transition metal compounds ($FeCl_3$, FeOCL, $TICl_4$, $ZrCl_4$, $HfCl_4$, $NbF_5$, $NbCl_5$, $TaCl_5$, $MoF_5$, $MoCl_5$, $WF_6$, $WCl_6$, $UF_6$, $LnCl_3$ (Ln=lanthanoid such as La, Ce, Pr, Nd, and Sm)), additionally, $O_2$, $O_3$, $XeOF_4$, $(NO_2^+)(SbF_6^-)$, $(NO_2^-)(SbCl_6^-)$, $(NO_2^+)(BF_4^-)$, $FSO_2OOSO_2F$, $AgClO_4$, $H_2IrCl_6$, $La(NO_3)_3 \cdot 6H_2O$, and the like.

Examples of the acidic compound include polyphosphoric acid described below, a hydroxy compound, a carboxy compound, a sulfonic acid compound, and a protonic acid (HF, HCl, $HNO_3$, $H_2SO_4$, $HClO_4$, $FSO_3H$, $ClSO_3H$, $CF_3SO_3H$, a variety of organic acids, amino acid, and the like).

Examples of the electron acceptor compound include tetracyanoquinodimethane (TCNQ), tetrafluorotetracyanoquinodimethane, halogenated tetarcynoquinodimethane, 1,1-dicyanovinylene, 1,1,2-tricyanovinylene, benzoquinone, heptafluorophenol, dicyanofluorenone, cyano-fluoroalkyl sulfonyl-fluorenone, pyridine, pyrazine, triazine, tetrazine, pyridopyrazine, benzothiadiazole, heterocyclic thiadiazole, porphyrin, phthalocyanine, a boron quinolate-based compound, a boron diketonate-based compound, a boron diisoindomethene-based compound, a carborane-based compound, other boron atom-containing compounds, and the electron acceptor compounds described in Chemistry Letters, 1991, pp. 1707 to 1710, and the like.

—Polyphosphoric Acid—

The polyphosphoric acid includes diphosphoric acid, pyrophosphoric acid, triphosphoric acid, tetraphosphoric acid, metaphosphoric acid, polyphosphoric acid, and a salt thereof. The polyphosphoric acid may be a mixture thereof. In the present invention, the polyphosphoric acid is preferably diphosphoric acid, pyrophosphoric acid, triphosphoric acid, and polyphosphoric acid, and more preferably polyphosphoric acid. The polyphosphoric acid can be synthesized by heating $H_3PO_4$ together with a sufficient amount of $P_4O_{10}$ (phosphoric anhydride), or by heating $H_3PO_4$ so as to remove water.

—Hydroxy Compound—

The hydroxy compound needs to be a compound having at least one hydroxyl group, and preferably includes a phenolic hydroxyl group. The hydroxy compound is preferably a compound represented by Formula (VIII).

[Chem. 4]

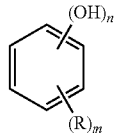

FORMULA (VIII)

In Formula (VIII), R represents a sulfo group, a halogen atom, an alkyl group, an aryl group, a carboxy group, or an alkoxycarbonyl group, n represents 1 to 6, and m represents 0 to 5.

R is preferably a sulfo group, an alkyl group, an aryl group, a carboxy group, or an alkoxycarbonyl group, and more preferably a sulfo group.

n is preferably 1 to 5, more preferably 1 to 4, and still more preferably 1 to 3.

m is 0 to 5, preferably 0 to 4, and more preferably 0 to 3.

—Carboxy Compound—

The carboxy compound needs to be a compound having at least one carboxy group, and is preferably a compound represented by Formula (IX) or (X)

[Chem. 5]

FORMULA (IX)

In Formula (IX), A represents a divalent linking group. The divalent linking group is preferably a combination of an alkylene group, an arylene group, or an alkenylene group and an oxygen atom, a sulfur atom or a nitrogen atom, and more preferably a combination of an alkylene group or an arylene group and an oxygen atom or a sulfur atom. Meanwhile, when the divalent linking group is a combination of an alkylene group and a sulfur atom, the compound also corresponds to a thioether compound. The above-described thioether compound is also preferably used.

When the divalent linking group represented by A includes an alkylene group, the alkylene group may have a substituent. The substituent is preferably an alkyl group, and more preferably has a carboxy group as a substituent.

[Chem. 6]

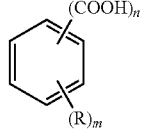

FORMULA (X)

In Formula (X), R represents a sulfo group, a halogen atom, an alkyl group, an aryl group, a hydroxy group, an alkoxycarbonyl group, n represents 1 to 6, and m represents 0 to 5.

R is preferably a sulfo group, an alkyl group, an aryl group, a hydroxy group, or an alkoxycarbonyl group, and more preferably a sulfo group or an alkoxycarbonyl group.

n is preferably 1 to 5, more preferably 1 to 4, and still more preferably 1 to 3.

m is 0 to 5, preferably 0 to 4, and more preferably 0 to 3.

—Sulfonic Acid Compound—

The sulfonic acid compound is a compound having at least one sulfo group, and preferably a compound having two or more sulfo groups. The sulfonic acid compound is preferably a compound substituted by an aryl group or an alkyl group, and more preferably a compound substituted by an aryl group.

In the hydroxy compound and the carboxy compound described above, a compound having a sulfo group as a substituent is also preferable.

These dopants can be used singly or in combination. The amount of the dopant being used is preferably 5 parts by mass or more, more preferably in a range of 5 parts by mass to 40 parts by mass, and still more preferably in a range of 5 parts by mass to 30 parts by mass with respect to 100 parts by mass of the polythiophene polymer from the viewpoint of the doping effect.

[Other Components]

The thermoelectric conversion material of the present invention may include other components in addition to the above-described components.

The thermoelectric conversion material may include a surfactant from the viewpoint of preventing variation during coating.

The thermoelectric conversion material may include lithium hydroxide, ammonium persulfate, an ultraviolet absorber, a polymerization inhibitor, a levelling additive, a matting agent, or the like to improve the dispersion stability.

The thermoelectric conversion material may include inorganic fine particles such as silica, titania, or zirconia, (crosslinked) polymer fine particles, a silane coupling agent, waxes, and the like from the viewpoint of adjusting the film strength and the viscosity. Particularly, the addition of silica and titania is preferable from the viewpoint of improving dispersibility through an increase in the viscosity.

Additionally, an antioxidant, a light-resistant stabilizer, a heat-resistant stabilizer, a plasticizer, and the like are appropriately included.

The content of these components is preferably in a range of approximately 0.1 mass % to 5 mass % with respect to the total mass of the thermoelectric conversion material.

[Preparation of Thermoelectric Conversion Material]

The thermoelectric conversion material of the present invention can be prepared by mixing the respective components described above. Preferably, the CNT, the polythiophene polymer, and the non-conjugated macromolecule are added to the solvent, are mixed together, and are dissolved or dispersed, thereby preparing the thermoelectric conversion material. The order of adding and mixing the respective components is not particularly limited, but it is preferable to add a predetermined amount of the polythiophene polymer to the solvent in advance, subsequently, add and disperse a predetermined amount of the CNT, and furthermore add the non-conjugated macromolecule.

There is no particular limitation regarding the preparation method, and the thermoelectric conversion material can be prepared using an ordinary mixing method, apparatus, and the like. Examples of the dispersion method that can be used include a mechanical homogenizer method, a jaw crasher method, an ultracentrifugal crushing method, a cutting mill method, an automatic mortar method, a disc mill method, a ball mill method, an ultrasonic homogenizer method, an ultrahigh-pressure homogenizer method, a roll mill dispersion method, and the like.

In addition, a combination of two or more of the above-described methods may be used as necessary. The combination of the dispersion methods is preferably a combination of the mechanical homogenizer method and the ultrasonic dispersion method, a combination of the ultrasonic homogenizer method and the roll mill dispersion method, or a combination of the ultrahigh-pressure homogenizer method and the roll mill dispersion method, and more preferably a combination of the ultrasonic homogenizer method and the roll mill dispersion method or a combination of the ultrahigh-pressure homogenizer method and the roll mill dispersion method. Regarding the order of the combination, the components are dispersed using the ultrasonic homogenizer method or the ultrahigh-pressure homogenizer method, and then are dispersed using the roll mill dispersion method. When the components are dispersed in the above-described order, it is possible to increase the viscosity using the ultrasonic homogenizer method or the ultrahigh-pressure homogenizer method, and then further disperse the CNT using the roll mill dispersion method.

The thermoelectric conversion material can also be prepared in the atmosphere, but is preferably prepared in an inert gas atmosphere. The inert gas atmosphere refers to a state in which the concentration of oxygen is smaller than that in the atmosphere, and is preferably 10% or less. An example of the method for setting the inert gas atmosphere that is preferably used is a method in which the atmosphere is substituted by gas such as nitrogen or argon.

In addition, the temperature during the preparation is preferably in a range of 0° C. to 50° C.

There are cases in which the CNT included in the obtained thermoelectric conversion material includes defective CNT. The defects of the above-described CNT degrade the electric conduction properties of the thermoelectric conversion material, and thus it is preferable to reduce the defective CNT. The amount of the defects of the CNT in the thermoelectric conversion material can be estimated from the ratio G/D of the G band to the D band in the Raman spectrum. It can be assumed that a high G/D ratio indicates the CNT material including a small amount of defects. In the present invention, the G/D ratio of the thermoelectric conversion material is preferably 10 or more, and more preferably 30 or more.

[Thermoelectric Conversion Element]

The thermoelectric conversion element of the present invention needs to be produced using the thermoelectric conversion material of the present invention for a thermoelectric conversion layer. The thermoelectric conversion layer can be obtained by molding the thermoelectric conversion material on a base material, and there is no particular limitation regarding the shape, the preparation method, and the like, but the thermoelectric conversion material of the present invention has favorable CNT-dispersing properties, and therefore it is possible to form the thermoelectric conversion layer by applying the thermoelectric conversion material and forming a film on the base material.

There is no particular limitation regarding the film-forming method, and a well-known coating method such as spin coating, extrusion die coating, blade coating, bar coating, screen printing, stencil printing, roll coating, curtain coating, spray coating, dip coating, or an ink jet method can be used.

After coating, a drying step is carried out as necessary. For example, it is possible to volatilize and dry the solvent by blowing hot air.

As the base material, it is possible to use a glass substrate, a transparent ceramic substrate, a metal substrate, a plastic film substrate, or the like. Specific examples of a plastic film that can be used in the present invention include polyester films such as polyethylene terephthalate, polyethylene isophthalate, polyethylene naphthalate, polybutylene terephthalate, poly(1,4-cyclohexylene dimethylene terephthalate), polyethylene-2,6-phthalenedicarboxylate, and a polyester film of bisphenol A and iso- and terephthalic acid; polycycloolefin films such as ZEONOR Film (manufactured by Zeon Corporation), ARTON FILM (manufactured by JSR Corporation), and SUMILITE FS1700 (manufactured by Sumitomo Bakelite Co., Ltd.), all of which are trade names; polyimide films such as KAPTON (manufactured by Du Pont-Toray Co., Ltd.), APICAL (manufactured by Kaneka Corporation), UPILEX (manufactured by Ube Industries, Ltd.) and POMIRAN (manufactured by Arakawa Chemical Industries, Ltd.), all of which are trade names; polycarbonate films such as PURE ACE (manufactured by Teijin Chemicals Ltd.) and ELMEC (manufactured by Kaneka Corporation), all of which are trade names; polyether ether ketone films such as SUMILITE FS1100 (trade name, manufactured by Sumitomo Bakelite Co., Ltd.); polyphenylsulfide films such as TORELINA (trade name, manufactured by Toray Industries, Inc.); and the like. The base material is appropriately selected depending on the usage conditions and environment; however, from viewpoints of procurement readiness, preferably, heat resistance at 100° C. or higher, economic efficiency, and the effect, commercially available polyethylene terephthalate, polyethylene naphthalate, a variety of polyimides, polycarbonate films, and the like are preferred. Particularly, it is preferable to use a base material including a variety of electrode materials provided on a pressure-bonding surface with the thermoelectric conversion layer. As the electrode materials, it is possible to use a transparent electrode such as ITO and ZnO; a metal electrode such as silver, copper, gold, aluminum, chromium, and nickel; a carbon material such as CNT and graphene; an organic material such as PEDOT/PSS; electrically conductive paste in which electrically conductive fine particles of silver, carbon, and the like are dispersed; and electrically conductive paste including metal nanowires of silver, copper, aluminum, and the like.

[Constitution of Thermoelectric Conversion Element]

The thermoelectric conversion element of the present invention needs to include a thermoelectric conversion layer for which the thermoelectric conversion material of the present invention is used, and the constitution thereof is not particularly limited. However, the element preferably includes the base material (substrate) and the thermoelectric conversion layer provided on the base material, more preferably further includes electrodes that electrically connect the base material and the thermoelectric conversion layer, and still more preferably includes the base material, a pair of electrodes on the base material, and the thermoelectric conversion layer disposed between the pair of the electrodes.

Figure 2:
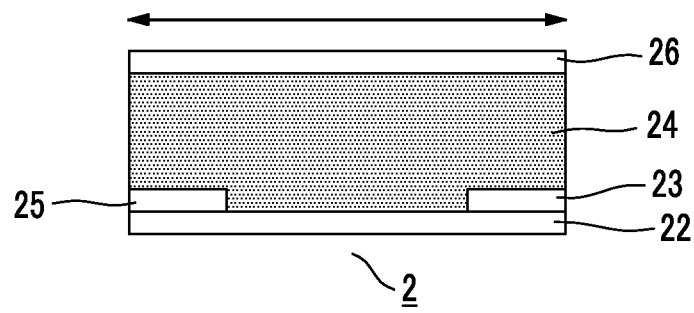
FIG. 2 is a view schematically illustrating an example of the thermoelectric conversion element of the present invention. The arrow in FIG. 2 indicates the direction of a temperature difference imparted during the use of the element.

Examples of the structure of the thermoelectric conversion element of the present invention are the structure of an element (1) illustrated in FIG. 1 and the structure of an element (2) illustrated in FIG. 2. The element (1) illustrated in FIG. 1 includes a pair of electrodes including a first electrode (13) and a second electrode (15) on a first base material (12) and a layer (14) of the thermoelectric conversion material of the present invention between the electrodes. The second electrode (15) is disposed on the surface of a second base material (16), and metal plates (11 and 17) are provided on the outside of the first base material (12) and the second base material (16) so as to face each other. The element (2) illustrated in FIG. 2 is provided with a first electrode (23) and a second electrode (25) on a first base material (22), and is provided with a layer (24) of the thermoelectric conversion material thereon. The arrows in FIGS. 1 and 2 indicate the orientations of temperature difference when the thermoelectric conversion element is being used.

The thermoelectric conversion element of the present invention is provided with the thermoelectric conversion material of the present invention on the base material in a film shape, and the base material is preferably made to function as the first base material (12, 22). That is, the structure is preferably a structure in which a variety of the above-described electrode materials are provided on the base material surface (the pressure-bonding surface with the thermoelectric conversion layer), and the thermoelectric conversion layer formed using the thermoelectric conversion material of the present invention is provided thereon.

One surface of the formed thermoelectric conversion layer is covered with the base material, and, when the thermoelectric conversion layer is used to prepare the thermoelectric conversion element, it is preferable to pressure-bond the base material (second base material (16, 26)) to the other surface from the viewpoint of protecting the film. In addition, a variety of the above-described electrode materials may be provided in advance on the surface (the pressure-bonding surface with the thermoelectric conversion layer) of the second base material (16). In addition, the second base material and the thermoelectric conversion layer are preferably pressure-bonded through heating at a temperature in a range of approximately 100° C. to 200° C. from the viewpoint of improving adhesiveness.

In the thermoelectric conversion element of the present invention, the film thickness of the thermoelectric conversion layer is preferably in a range of 0.1 µm to 1000 µm, and more preferably in a range of 1 µm to 100 µm. When the film thickness is set in the above-described range, the temperature difference can be easily imparted, and it is possible to prevent the resistance in the film from increasing.

In addition, the thicknesses of the first and second base materials are preferably in a range of 30 µm to 3000 µm, more preferably in a range of 50 µm to 1000 µm, still more preferably in a range of 100 µm to 1000 µm, and particularly preferably in a range of 200 µm to 800 µm in terms of handling properties, durability, and the like. When the thickness of the base material is set in the above-described range, the thermal conductivity does not decrease, and the film (thermoelectric conversion layer) is not easily damaged due to external shock.

Generally, in the thermoelectric conversion element, compared with a photoelectric conversion element such as an element for an organic thin film solar cell, one organic layer is applied and formed as the thermoelectric conversion layer, and the element can be easily manufactured. Particularly, when the thermoelectric conversion material of the present invention is used, it is possible to increase the film thickness approximately 100 times to 1000 times compared with an element for an organic thin film solar cell, and the chemical stability against oxygen or moisture in the air improves.

The thermoelectric conversion element of the present invention can be preferably used as a power generation element for an article for thermoelectric power generation, and specifically, can be preferably used for usages such as a power generator such as a hot water heat power generator, a solar power generator, or a waste heat power generator, or a power supply for a wrist watch, a semiconductor-driving power supply, or a power supply for a small-scale sensor.

EXAMPLES

Hereinafter, the present invention will be described in more detail on the basis of examples, but the present invention is not limited thereto.

In the examples and comparative examples, the following polythiophenes were used.

Polythiophene 1 (regiorandom, HT bond proportion: <90%)

Polythiophene 1 (regioregular, HT bond proportion: ≥95%)

Polythiophene 2 (regiorandom, HT bond proportion: <90%)

Polythiophene 2 (regioregular, HT bond proportion: ≥95%)

Polythiophene 3 (regiorandom, HT bond proportion: <90%)

Polythiophene 4 (regiorandom, HT bond proportion: <90%)

Polythiophene 5 (regiorandom, HT bond proportion: <78%)

Polythiophene 6 (regiorandom, HT bond proportion: <72%)

The polythiophenes 1 to 4 were all manufactured by Sigma-Aldrich Japan K.K., and the polythiophenes 5 and 6 were synthesized as descried below.

The proportion of the HT bonds in the polythiophene polymer was confirmed by analyzing the integral value of the signals of a thienyl group-bonding methylene proton in a methylene region in $^1$H-NMR.

The structures of the polythiophenes 1 to 6 used are illustrated below.

[Chem. 7]

POLYTHIOPHENE 1: POLY(3-BUTYL)THIOPHENE
WEIGHT-AVERAGE MOLECULAR WEIGHT: 68,000

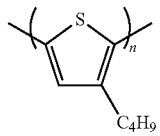

POLYTHIOPHENE 2: POLY(3-HEXYL)THIOPHENE
WEIGHT-AVERAGE MOLECULAR WEIGHT: 87,000

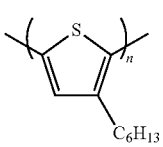

POLYTHIOPHENE 3: POLY(3-OCTYL)THIOPHENE
WEIGHT-AVERAGE MOLECULAR WEIGHT: 98,000

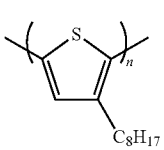

POLYTHIOPHENE 4: POLY(3-DECYL)THIOPHENE
WEIGHT-AVERAGE MOLECULAR WEIGHT: 121,000

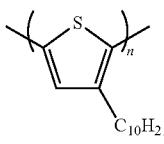

-continued

POLYTHIOPHENE 5: POLY(3-(2-ETHYL HEXYL))THIOPHENE
WEIGHT-AVERAGE MOLECULAR WEIGHT: 127,000

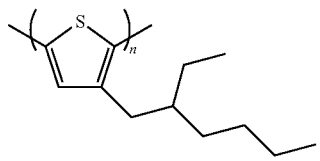

POLYTHIOPHENE 6: POLY(3-(2-ISOBUTYL))THIOPHENE
WEIGHT-AVERAGE MOLECULAR WEIGHT: 60,000

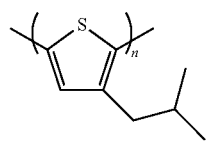

The polythiophene 5 was synthesized using the following method.

Synthesis of 3-(2-ethyl hexyl)thiophene Monomer A 3.27 g (20 mmol) of 3-bromothiophene was dissolved in 20 mL of dehydrated THF in a nitrogen flow, and was cooled to 0° C. 24 mL (24 mmol) of 2-ethyl hexyl magnesium bromide (1 M diethyl ether solution) was added dropwise to this solution, and, after the completion of the dropwise addition, was heated to reflux for three hours. After the reaction solution was cooled in the air, an organic layer was separated by adding water and a 10% hydrochloric acid aqueous solution, was washed using water and saline water, and was dried using magnesium sulfate. After the condensation of the solution, the solution was purified using silica gel column chromatograph (hexane 100%), thereby obtaining 2.6 g (yield: 66%) of a colorless thiophene monomer A. The obtained compound was conformed to be an intended compound through $^1$H-NMR.

[Polymerization of Polythiophene 5]

0.82 g (5.06 mmol) of iron (III) chloride was dissolved in 10 mL of chloroform in a nitrogen flow, 0.25 g (1.27 mmol) of the thiophene monomer A synthesized above was added dropwise, and the components were stirred for two hours at room temperature. The reaction was stopped by adding water and methanol to the reaction solution, the generated black sediment was dissolved again in 100 mL of chloroform, and metal impurities were washed away by adding 100 mL of additional water, and stirring the components. A chloroform layer was condensed, and acetone was added, thereby obtaining red sediment. This sediment was Soxhlet-washed in a solvent of acetone and methanol (having a volume ratio of 1:1), thereby obtaining the polythiophene 5. The obtained compound was conformed to be an intended compound through $^1$H-NMR. In addition, it was confirmed that the proportion of the HT bonds was 78% from the integral ratio of methylene proton at the a position of a 2-ethyl hexyl group.

$^1$H-NMR: 0.89 (6H), 1.29 (8H), 1.70 (1H), 2.49, 2.75 (α-CH$_2$), 6.9 (br, Ar)

The polythiophene 6 was synthesized using the following method.

Synthesis of 3-(isobutyl)thiophene Monomer B 3.27 g (20 mmol) of 3-bromothiophene was dissolved in 20 mL of dehydrated THF in a nitrogen flow, and was cooled to 0° C. 24 mL (24 mmol) of isobutyl magnesium bromide (1M THF solution) was added dropwise to this solution, and, after the completion of the dropwise addition, was heated to reflux for three hours. After the reaction solution was cooled in the air, an organic layer was separated by adding water and a 10% hydrochloric acid aqueous solution, was washed using water and saline water, and was dried using magnesium sulfate. After the condensation of the solution, the solution was purified using Kugelrohr distillation silica gel column chromatograph (hexane 100%), thereby obtaining 12.6 g (yield: 36%) of a colorless thiophene monomer B. The obtained compound was conformed to be an intended compound through $^1$H-NMR.

[Polymerization of Polythiophene 6]

0.82 g (5.06 mmol) of iron (III) chloride was dissolved in 10 mL of chloroform in a nitrogen flow, 0.25 g (1.27 mmol) of the thiophene monomer B synthesized above was added dropwise, and the components were stirred for two hours at room temperature. The reaction was stopped by adding water and methanol to the reaction solution, the generated black sediment was dissolved again in 100 mL of chloroform, and metal impurities were washed away by adding 100 mL of additional water, and stirring the components. A chloroform layer was condensed, and acetone was added, thereby obtaining red sediment. This sediment was Soxhlet-washed in a solvent of acetone and methanol (having a volume ratio of 1:1), thereby obtaining the polythiophene 6. The obtained compound was conformed to be an intended compound through $^1$H-NMR. In addition, it was confirmed that the proportion of the HT bonds was 72% from the integral ratio of methylene proton at the α position of an isobutyl group.

$^1$H-NMR: 0.95 (6H), 2.05 (1H), 2.5, 2.7 (α-CH$_2$), 6.9 (br, Ar) 0.89 (6H), 1.29 (8H), 1.70 (1H), 2.49, 2.75, 6.9 (br, Ar)

The weight-average molecular weights of the respective polythiophene polymers were obtained through gel-permeation chromatography (GPC) in a form of the polystyrene equivalent value. In detail, o-dichlorobenzene was added to each polythiophene polymer, was dissolved at 145° C., and was filtered using a 1.0 μm sintered filter, thereby preparing 0.15 wv % of a specimen solution, and the weight-average molecular weight of the specimen solution was measured under the following conditions.

Device: "Alliance GPC2000 (manufactured by Waters)"
Column: TSKgel GMH$_6$-HT×2+TSKgel GMH$_6$-HTL×2 (for all, 7.5 mmI.D.×30 cm, manufactured by Tosoh Corporation)
Column temperature: 140° C.
Detector: differential refractive index meter
Mobile phase: o-dichlorobenzene Example 1-1

1. Production of Carbon Nanotube-Dispersed Paste 40 ml of o-dichlorobenzene was added to 320 mg of the polythiophene 1 (regiorandom), thereby producing a polythiophene solution 1-1 using an ultrasonic washer "US-2" (manufactured by Iuchi Seieido Co., Ltd., output 120 W, indirect radiation). The solubility of the polythiophene was evaluated using the following method.

Next, 640 mg of ASP-100F (manufactured by Hanwha Nanotech Corporation, purity 95%) was added to the solution 1-1 as a single-layer carbon nanotube, was ultrasonic-dispersed at 30° C. for 30 minutes using an ultrasonic homogenizer VC-750 (manufactured by Sonics & Materials Inc., taper microchip (having a probe diameter of 6.5 mm) was used, output 40 W, direction radiation, duty ratio 50%), and furthermore, was ultrasonic-dispersed at 30° C. for 60 minutes using an ultrasonic washer "US-2" (manufactured by Iuchi Seieido Co., Ltd., output 120 W, indirect radiation), thereby producing a carbon nanotube-dispersed solution 1-1.

Next, 1.28 g of polystyrene (manufactured by Wako Pure Chemical Industries, Ltd.) having a polymerization degree of 2,000 was added to the dispersed solution 1-1 as the non-conjugated macromolecule, was dissolved in a 50° C. hot bath, and then was stirred for five minutes at a rotation speed of 2,000 rpm using a planetary centrifugal mixer ARE-250 (manufactured by Thinky Corporation), thereby producing carbon nanotube-dispersed paste 1-1. The concentration of the solid content in the paste was 4.1 mass %, and the content ratio of the CNT to the solid content was 28.5 mass %. The dispersibility of the CNT was evaluated using the following method.

2. Production of Thermoelectric Conversion Layer

A film was formed on a substrate using the above-prepared carbon nanotube-dispersed paste 1-1, thereby forming a thermoelectric conversion layer.

In detail, after ultrasonic washing in isopropyl alcohol, a 2 mm-thick metal mask having a 13 mm×13 mm opening section formed by a laser process was placed on a 1.1 mm-thick glass substrate which had been subjected to a UV-ozone treatment for 10 minutes. Next, the above-prepared carbon nanotube-dispersed paste 1-1 was injected through the opening section, then, the metal mask was removed, and subsequently, the glass substrate was heated and dried on an 80° C. hot plate, thereby producing a thermoelectric conversion layer 1-1. The film-forming properties, electric conductivity, and thermoelectric performance of the thermoelectric conversion layer were evaluated.

3. Production of Thermoelectric Conversion Element

Figure 3:
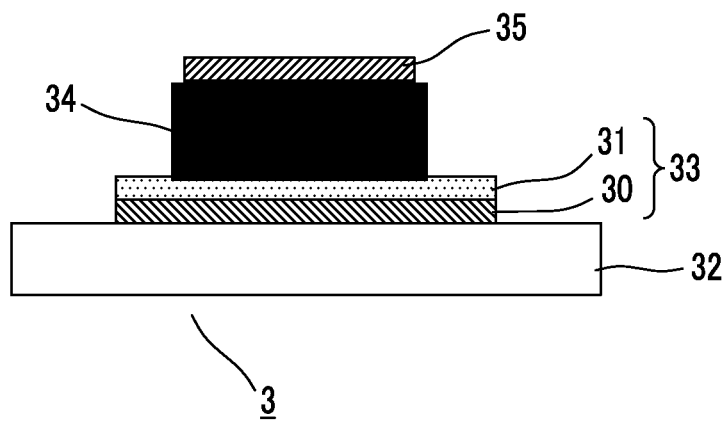
FIG. 3 is a schematic view of a thermoelectric conversion element produced in an example.

A thermoelectric conversion element illustrated in FIG. 3 was produced using the above-prepared carbon nanotube-dispersed paste 1-1.

In detail, after ultrasonic washing in isopropyl alcohol, a 100 nm-thick chromium layer and then a 200 nm-thick gold layer (30 and 31) were laminated through an ion plating method on a 40 mm×50 mm glass substrate (32) having a thickness of 1.1 m using a metal mask having a 20 mm×20 mm opening section formed by etching, thereby forming an electrode 1 (33).

Next, the above-prepared carbon nanotube-dispersed paste 1-1 was injected using the 2 mm-thick metal mask having a 13 mm×13 mm opening section formed by a laser process, and then the glass substrate was heated and dried on an 80° C. hot plate, thereby producing a thermoelectric conversion layer 1-1 (34) on the electrode 1.

Next, a conductive silver paste DOTITE D-550 (manufactured by Fujikura Kasei Co., Ltd., silver paste) was applied using a screen printing method so as to form an electrode 2 (35) on the thermoelectric conversion layer 1-1, a thermoelectric conversion element 1-1 (3) was produced, and the thermoelectric force thereof was evaluated.

4. Test Method

The test methods for properties and the like in the examples and comparative examples of the present invention are as described below.

[Polythiophene Solubility]

The polythiophene solubility was evaluated using the following four standards on the basis of the visual observation when the polythiophene was dissolved in the solvent.

1: The dissolution time into the solvent was shorter than one minute.

2: The dissolution time into the solvent was in a range of 1 minute to shorter than 5 minutes.

3: The dissolution time into the solvent was in a range of 5 minutes to shorter than 15 minutes.

4: The dissolution time into the solvent was 15 minutes or longer.

[CNT-Dispersing Properties]

The CNT-dispersing properties were evaluated using the following four standards by dropping the paste onto a glass slide, placing glass over thereon, and then visually observing the paste.

1: No black aggregates were observed.

2: Black aggregates having a size of less than 0.5 mm were observed.

3: Black aggregates having a size in a range of 0.5 mm to less than 1 mm were observed.

4: Black aggregates exceeding Standard 3 were observed.

[Film-Forming Properties]

The film-forming properties were evaluated using the following three standards on the basis of the visual observation.

1: The size of the thermoelectric conversion layer is 1.5 times or less the opening section in the metal mask.

2: The size of the thermoelectric conversion layer is more than 1.5 times to 2.0 times the opening section in the metal mask.

3: The size of the thermoelectric conversion layer is more than 2.0 times the opening section in the metal mask.

[Measurement of Electric Conductivity]

The electric conductivity of the thermoelectric conversion material was obtained by measuring the surface resistivity (unit: $\Omega/\square$) using a "low resistivity meter LORESTA GP" (manufactured by Mitsubishi Chemical Analytech Co., Ltd.), measuring the film thickness using a contact-type thickness meter (unit: cm), and computing the electric conductivity (S/cm) using the following equation.

(Electric conductivity)=1/((surface resistivity)×(film thickness))

[Thermoelectric Performance: PF]

For the thermoelectric performance of the thermoelectric conversion material, the Seebeck coefficient (V/K) and the electric conductivity (S/m) were measured at a temperature of 100° C. in the atmosphere using a thermoelectric conversion characteristic measurement machine MODEL RZ2001i (manufactured by Ozawa Science Co., Ltd.). From the obtained Seebeck coefficient and electric conductivity, a power factor (PF) was computed using the following equation as the thermoelectric conversion characteristic.

PF($\mu$W/(m·K))=(Seebeck coefficient)$^2$×(electric conductivity)

[Thermoelectric Force]

For the thermoelectric force of the thermoelectric conversion element, the voltage difference caused between the electrode 1 and the electrode 2 when the glass substrate in the thermoelectric conversion element was heated on the hot plate having a surface temperature of 80° C. was measured using a digital multi-meter R6581 (manufactured by Advantest Corporation).

Examples 1-2 to 1-5

Thermoelectric conversion layers and thermoelectric conversion elements were produced in the same manner as in Example 1-1 except for the fact that the polythiophene 1 used in Example 1-1 was changed to the same amount of the polythiophene 2 (regiorandom), the polythiophene 3 (regiorandom), the polythiophene 5 (regiorandom), and the polythiophene 6 (regiorandom), and the characteristics thereof were evaluated. The results are described in Table 1-1.

Comparative Examples 1-1 and 1-2

Thermoelectric conversion layers and thermoelectric conversion elements were produced in the same manner as in Example 1-1 except for the fact that the regiorandom polythiophene 1 used in Example 1-1 was changed to regioregular polythiophene 1 and regioregular polythiophene 2, and the characteristics thereof were evaluated. The results are described in Table 1-1.

Comparative Example 1-3

A thermoelectric conversion layer and a thermoelectric conversion element were produced in the same manner as in Example 1-1 except for the fact that the carbon nanotube-dispersed paste 1-1 used in Example 1-1 was changed to carbon nanotube-dispersed paste for comparison described below, and the characteristics thereof were evaluated. The results are described in Table 1-1.

[Production of Carbon Nanotube-Dispersed Paste for Comparison]

40 ml of o-dichlorobenzene was added to 2.24 g of the polythiophene 1 (regiorandom), thereby producing a polythiophene solution using an ultrasonic washer "US-2" (manufactured by Iuchi Seieido Co., Ltd., output 120 W, indirect radiation).

Next, 800 mg of ASP-100F (manufactured by Hanwha Nanotech Corporation, purity 95%) was added to the solution as a single-layer carbon nanotube, was ultrasonic-dispersed at 30° C. for 30 minutes using an ultrasonic homogenizer VC-750 (manufactured by Sonics & Materials Inc., taper microchip (having a probe diameter of 6.5 mm) was used, output 40 W, direction radiation, duty ratio 50%), and furthermore, was ultrasonic-dispersed at 30° C. for 630 minutes using an ultrasonic washer "US-2" (manufactured by Iuchi Seieido Co., Ltd., output 120 W, indirect radiation), thereby producing carbon nanotube-dispersed paste for comparison.

TABLE 1-1

| | Poly-thiophene | Non-conjugated macromolecule | HT bond ratio | Poly-thiophene solubility | CNT-dispersing properties | Film-forming properties | Electric conductivity (S/cm) | PF | Thermo-electric force |
|---|---|---|---|---|---|---|---|---|---|
| Example 1-1 | 1 (regio-random) | Polystyrene | <90% | 2 | 2 | 1 | 51 | 1.8 | 1.9 |
| Example 1-2 | 2 (regio-random) | Polystyrene | <90% | 2 | 2 | 1 | 62 | 2.1 | 2.3 |

TABLE 1-1-continued

|  | Poly-thiophene | Non-conjugated macromolecule | HT bond ratio | Poly-thiophene solubility | CNT-dispersing properties | Film-forming properties | Electric conductivity (S/cm) | PF | Thermo-electric force |
|---|---|---|---|---|---|---|---|---|---|
| Example 1-3 | 3 (regio-random) | Polystyrene | <90% | 2 | 2 | 1 | 68 | 2.3 | 2.4 |
| Example 1-4 | 5 (regio-random) | Polystyrene | 78% | 1 | 1 | 1 | 59 | 1.6 | 1.7 |
| Example 1-5 | 6 (regio-random) | Polystyrene | 72% | 1 | 1 | 1 | 55 | 1.4 | 1.4 |
| Comparative Example 1-1 | 1 (regio-regular) | Polystyrene | ≥95% | 4 | 3 | 2 | 21 | 0.8 | 0.7 |
| Comparative Example 1-2 | 2 (regio-regular) | Polystyrene | ≥95% | 3 | 3 | 2 | 30 | 1 | 1 |
| Comparative Example 1-3 | 1 (regio-random) | None | <90% | 2 | 2 | 3 | Not measurable | Not measurable | Not measurable |

* PF and the thermoelectric forces were evaluated using the relative values with respect to Comparative Example 1-2.

As is evident from Table 1-1, Examples 1-1 to 1-5 having the thermoelectric conversion layer including the regiorandom polythiophene, the CNT, and the non-conjugated macromolecule were favorable in terms of the polythiophene solubility, the CNT-dispersing properties, and the film-forming properties, and were excellent in terms of the electric conductivity, the thermoelectric performance (PF), and the thermoelectric force. Examples 1-4 and 1-5 in which the regiorandom polythiophene having a branched alkyl group as a side chain was used were particularly excellent in terms of the polythiophene solubility and the CNT-dispersing properties.

On the other hand, Comparative Examples 1-1 and 1-2 in which the regioregular polythiophene was used were poor in terms of the polythiophene solubility and the CNT-dispersing properties compared with the examples, and also had significantly decreased electric conductivities. In addition, since the film-forming properties were degraded, and accordingly, the film thicknesses of the thermoelectric conversion elements were decreased, the temperature difference decreased, and the thermoelectric force was also decreased. As a result, the thermoelectric performance (PF) also degraded. In addition, Comparative Example 1-3 in which the non-conjugated macromolecule was not included had extremely poor film-forming properties, and was not capable of maintaining the pattern after printing. Therefore, it was not possible to form a thermoelectric conversion layer, and the performance also could not be evaluated.

Examples 1-6 and 1-7

Thermoelectric conversion layers and thermoelectric conversion elements were produced in the same manner as in Example 1-4 except for the fact that the o-dichlorobenzene in Example 1-4 was changed to the same amount of mesitylene or tetralin, and the characteristics thereof were evaluated. The results are described in Table 1-2.

TABLE 1-2

|  | Poly-thiophene | HT bond ratio | Solvent | Poly-thiophene solubility | CNT-dispersing properties | Film-forming properties | Electric conductivity (S/cm) | PF | Thermo-electric force |
|---|---|---|---|---|---|---|---|---|---|
| Example 1-6 | 5 (regio-random) | 78% | mesitylene | 2 | 1 | 1 | 38 | 2.6 | 1.4 |
| Example 1-7 | 5 (regio-random) | 78% | tetralin | 2 | 1 | 1 | 33 | 2.3 | 1.5 |

* PF and the thermoelectric forces were evaluated using the relative values with respect to Example 1-4.

As is evident from Table 1-2, Examples 1-6 and 1-7 in which mesitylene or tetralin was used as the solvent exhibited the same excellent results as Example 1-4, and the thermoelectric performance (PF), and the thermoelectric force were superior.

Example 2-1

A thermoelectric conversion layer and a thermoelectric conversion element were produced in the same manner as in Example 1-1 except for the fact that the polythiopene used in Example 1-1 was changed to the same amount of the polythiophene 5 (regiorandom), and the characteristics thereof were evaluated. In addition, for the polythiophene 5 used, the content of Fe was analyzed using the following ICP mass analyzing method. The results are described in Table 2.

[Determination of Amount of Fe Impurity]

The amount of Fe impurities in the polythiophene was determined through the ICP mass analyzing method using an "ICP-MS Agilent 7500cs" (manufactured by Agilent Technologies). The specimen was weighed in a crucible, then, an ashing operation was carried out, an overheating condensation operation was carried out by adding a concentrated acid, and a dilute acid was added, thereby collecting Fe elements from the specimen. Furthermore, the solution was diluted using a dilute acid (addition of internal standard), and the amount of Fe was determined.

TABLE 2

|  | Poly-thiophene | HT bond ratio | Amount of impurities (Fe) ppm | Poly-thiophene solubility | CNT-dispersing properties | Film-forming properties | PF | Thermo-electric force |
|---|---|---|---|---|---|---|---|---|
| Example 2-1 | 5 (regio-random) | 78% | 830 | 1 | 1 | 1 | 1.6 | 1.7 |

* PF and the thermoelectric forces were evaluated using the relative values with respect to Comparative Example 1-2.

As is evident from Table 2, in Examples 2-1 in which the polythiophene having a small amount of the metal impurities was used, the polythiophene solubility, the CNT-dispersing properties, and the film-forming properties were all excellent. In addition, the thermoelectric performance (PF) and the thermoelectric force were also high.

Example 3-1

40 ml of o-dichlorobenzene was added to 480 mg of the polythiophene 2 (regiorandom), thereby producing a polythiophene solution 3-1 using an ultrasonic washer "US-2" (manufactured by Iuchi Seieido Co., Ltd., output 120 W, indirect radiation) under conditions of 40° C. and 10 minutes.

Next, 960 mg of ASP-100F (manufactured by Hanwha Nanotech Corporation, purity 95%) was added to the solution 3-1 as a single-layer carbon nanotube, was ultrasonic-dispersed at 30° C. for 30 minutes using an ultrasonic homogenizer VC-750 (manufactured by Sonics & Materials Inc., taper microchip (having a probe diameter of 6.5 mm) was used, output 50 W, direction radiation, duty ratio 50%), and furthermore, was ultrasonic-dispersed at 30° C. for 60 minutes using an ultrasonic washer "US-2" (manufactured by Iuchi Seieido Co., Ltd., output 120 W, indirect radiation), thereby producing a carbon nanotube-dispersed solution 3-1.

Next, 1.92 g of polystyrene (manufactured by Wako Pure Chemical Industries, Ltd.) having a polymerization degree of 2,000 was added to the dispersed solution 3-1 as the non-conjugated macromolecule, was dissolved in a 50° C. hot bath, and then was stirred for 15 minutes at a rotation speed of 2,000 rpm using a planetary centrifugal mixer ARE-250 (manufactured by Thinky Corporation), thereby producing carbon nanotube-dispersed paste 3-1. The concentration of the solid content (the concentration of the total solid content) in the paste was 6.1 mass %, and the content ratio of the CNT to the solid content was 28.5 mass %.

Examples 3-2 to 3-4

Carbon nanotube-dispersed pastes 3-2 to 3-4 were produced in the same manner as in Example 3-1 except for the fact that the polythiophene 2 was changed to the same amount of the polythiophene 3 (regiorandom), the polythiophene 4 (regiorandom), and the polythiophene 5 (regiorandom).

Example 3-5

40 ml of o-dichlorobenzene was added to 640 mg of the polythiophene 3 (regiorandom), thereby producing a polythiophene solution 3-5 using an ultrasonic washer "US-2" (manufactured by Iuchi Seieido Co., Ltd., output 120 W, indirect radiation).

Next, 1.28 g of ASP-100F (manufactured by Hanwha Nanotech Corporation, purity 95%) was added to the solution 3-5 as a single-layer carbon nanotube, was ultrasonic-dispersed at 30° C. for 30 minutes using an ultrasonic homogenizer VC-750 (manufactured by Sonics & Materials Inc., taper microchip (having a probe diameter of 6.5 mm) was used, output 50 W, direction radiation, duty ratio 50%), and furthermore, was ultrasonic-dispersed at 30° C. for 60 minutes using an ultrasonic washer "US-2" (manufactured by Iuchi Seieido Co., Ltd., output 120 W, indirect radiation), thereby producing a carbon nanotube-dispersed solution 3-5.

Next, 5.12 g of polystyrene (manufactured by Wako Pure Chemical Industries, Ltd.) having a polymerization degree of 2,000 was added to the dispersed solution 3-5 as the non-conjugated macromolecule, was dissolved in a 50° C. hot bath, and then was stirred for 15 minutes at a rotation speed of 2,000 rpm using a planetary centrifugal mixer ARE-250 (manufactured by Thinky Corporation), thereby producing carbon nanotube-dispersed paste 3-5. The concentration of the solid content in the paste was 11.9 mass %, and the content ratio of the CNT to the solid content was 18.1 mass %.

Example 3-6

Carbon nanotube-dispersed paste 3-6 was produced in the same manner as in Example 3-5 except for the fact that the polythiophene 3 was changed to the same amount of the polythiophene 5 (regiorandom).

Comparative Example 3-1

Carbon nanotube-dispersed paste for comparison 3-1 was produced in the same manner as in Example 3-1 except for the fact that the polythiophene 2 (regiorandom) was changed to the polythiophene 2 (regioregular).

Thermoelectric conversion layers and thermoelectric conversion elements were produced in the same manner as in Example 1-1 except for the fact that the carbon nanotube-dispersed paste 1-1 used in Example 1-1 was changed to the respective pastes produced above, and the characteristics thereof were evaluated. The results are described in Table 3. The concentration of the solid content in Table 3 indicates the concentration of the solid content in the carbon nanotube-dispersed paste.

TABLE 3

|  | Poly-thiophene | Non-conjugated macromolecule | HT bond ratio | Concentration of solid content | Poly-thiophene solubility | CNT-dispersing properties | Film-forming properties | Electric conductivity (S/cm) | PF | Thermo-electric force |
|---|---|---|---|---|---|---|---|---|---|---|
| Example 3-1 | 2 (regio-random) | Polystyrene | <90% | 6.1 mass % | 3 | 2 | 1 | 48 | 1.6 | 1.9 |
| Example 3-2 | 3 (regio-random) | Polystyrene | <90% | 6.1 mass % | 2 | 2 | 1 | 54 | 1.9 | 2.4 |
| Example 3-3 | 4 (regio-random) | Polystyrene | <90% | 6.1 mass % | 2 | 2 | 1 | 52 | 1.9 | 2.5 |
| Example 3-4 | 5 (regio-random) | Polystyrene | 78% | 6.1 mass % | 1 | 1 | 1 | 50 | 1.5 | 1.9 |
| Example 3-5 | 3 (regio-random) | Polystyrene | <90% | 11.9 mass % | 3 | 3 | 1 | 47 | 1.4 | 1.8 |
| Example 3-6 | 5 (regio-random) | Polystyrene | 78% | 11.9 mass % | 1 | 1 | 1 | 45 | 1.2 | 1.5 |
| Comparative Example 3-1 | 2 (regio-regular) | Polystyrene | ≥95% | 6.1 mass % | 4 | 4 | 2 | Not measurable | Not measurable | Not measurable |

* PF and the thermoelectric forces were evaluated using the relative values with respect to Comparative Example 1-2.

As is evident from Table 3, Examples 3-1 to 3-6 having the thermoelectric conversion layer including the regiorandom polythiophene, the CNT, and the non-conjugated macromolecule were excellent in terms of the CNT-dispersing properties and the film-forming properties, and were also excellent in terms of the electric conductivity, the thermoelectric performance (PF), and the thermoelectric force. Examples 3-4 and 3-6 in which the regiorandom polythiophene having a branched alkyl group as a side chain was used were particularly excellent in terms of the polythiophene solubility and the CNT-dispersing properties, and favorable dispersibility could be obtained even when the concentration of the solid content in the CNT was high.

On the other hand, Comparative Example 3-1 in which the regioregular polythiophene was used were significantly degraded in terms of the thiophene solubility and the CNT-dispersing properties, and was poor in terms of the film-forming properties. In addition, the CNT aggregate increased the roughness of the surface of the thermoelectric conversion layer, and the performance evaluation was not possible.

Example 4-1

40 ml of o-dichlorobenzene was added to 960 mg of the polythiophene 5 (regiorandom), thereby producing a polythiophene solution 4-1 using an ultrasonic washer "US-2" (manufactured by Iuchi Seieido Co., Ltd., output 120 W, indirect radiation).

Next, 1.28 g of ASP-100F (manufactured by Hanwha Nanotech Corporation, purity 95%) was added to the solution 4-1 as a single-layer carbon nanotube, was ultrasonic-dispersed at 30° C. for 30 minutes using an ultrasonic homogenizer VC-750 (manufactured by Sonics & Materials Inc., taper microchip (having a probe diameter of 6.5 mm) was used, output 50 W, direction radiation, duty ratio 50%), and furthermore, was ultrasonic-dispersed at 30° C. for 60 minutes using an ultrasonic washer "US-2" (manufactured by Iuchi Seieido Co., Ltd., output 120 W, indirect radiation), thereby producing a carbon nanotube-dispersed solution 4-1.

Next, 1.5 g of polystyrene (manufactured by Wako Pure Chemical Industries, Ltd.) having a polymerization degree of 2,000 was added to the dispersed solution 4-1 as the non-conjugated macromolecule, was dissolved in a 50° C. hot bath, and then was stirred for 20 minutes at a rotation speed of 2,200 rpm using a planetary centrifugal mixer ARE-250 (manufactured by Thinky Corporation), thereby producing carbon nanotube-dispersed paste 4-1. The concentration of the solid content in the paste was 6.7 mass %, and the content ratio of the CNT to the solid content was 34 mass %.

Example 4-2

Carbon nanotube-dispersed paste 4-2 was produced in the same manner as in Example 4-1 except for the fact that the polythiophene 5 was changed to the same amount of the polythiophene 6 (regiorandom).

Example 4-3

40 ml of o-dichlorobenzene was added to 750 mg of the polythiophene 5 (regiorandom), thereby producing a polythiophene solution 4-3 using an ultrasonic washer "US-2" (manufactured by Iuchi Seieido Co., Ltd., output 120 W, indirect radiation).

Next, 1.5 g of ASP-100F (manufactured by Hanwha Nanotech Corporation, purity 95%) was added to the solution 4-3 as a single-layer carbon nanotube, was ultrasonic-dispersed at 30° C. for 45 minutes using an ultrasonic homogenizer VC-750 (manufactured by Sonics & Materials Inc., taper microchip (having a probe diameter of 6.5 mm) was used, output 50 W, direction radiation, duty ratio 50%), and furthermore, was ultrasonic-dispersed at 30° C. for 60 minutes using an ultrasonic washer "US-2" (manufactured by Iuchi Seieido Co., Ltd., output 120 W, indirect radiation), thereby producing a carbon nanotube-dispersed solution 4-3.

Next, 750 mg of polystyrene (manufactured by Wako Pure Chemical Industries, Ltd.) having a polymerization degree of 2,000 was added to the dispersed solution 4-3 as the non-conjugated macromolecule, was dissolved in a 50° C. hot bath, and then was stirred for 30 minutes at a rotation speed of 2,200 rpm using a planetary centrifugal mixer ARE-250 (manufactured by Thinky Corporation), thereby producing carbon nanotube-dispersed paste 4-3. The concentration of the solid content in the paste was 5.5 mass %, and the content ratio of the CNT to the solid content was 50 mass %.

Thermoelectric conversion layers and thermoelectric conversion elements were produced in the same manner as in Example 1-1 except for the fact that the carbon nanotube-dispersed paste 1-1 used in Example 1-1 was changed to the respective pastes produced above, and the characteristics thereof were evaluated. The results are described in Table 4. The concentration of the CNT in Table 4 indicates the concentration of the CNT in the total solid content.

TABLE 4

|  | Poly-thiophene | Non-conjugated macromolecule | HT bond ratio | Concentration of CNT | Poly-thiophene solubility | CNT-dispersing properties | Film-forming properties | Electric conductivity (S/cm) | PF | Thermo-electric force |
|---|---|---|---|---|---|---|---|---|---|---|
| Example 4-1 | 5 (regio-random) | Polystyrene | 78% | 34 mass % | 1 | 1 | 1 | 65 | 1.8 | 1.6 |
| Example 4-2 | 6 (regio-random) | Polystyrene | 72% | 34 mass % | 2 | 3 | 1 | 54 | 1.6 | 1.5 |
| Example 4-3 | 5 (regio-random) | Polystyrene | 78% | 50 mass % | 1 | 2 | 1 | 75 | 2.3 | 2.0 |

* PF and the thermoelectric forces were evaluated using the relative values with respect to Comparative Example 1-2.

As is clear from Table 4, in Examples 4-1 and 4-3 in which the regiorandom polythiophene 5 having a 2-ethyl hexyl group as a side chain was used among Examples 4-1 to 4-3 including the regiorandom polythiophene having a branched alkyl as a side chain, particularly, the polythiophene solubility, the CNT-dispersing properties, and the film-forming properties were excellent, and favorable dispersibility could be obtained even when the concentration of the CNT was high.

Example 5-1

30 ml of o-dichlorobenzene was added to 30 mg of the polythiophene 3 (regiorandom), thereby producing a polythiophene solution 5-1 using an ultrasonic washer "US-2" (manufactured by Iuchi Seieido Co., Ltd., output 120 W, indirect radiation).

Next, 480 mg of KH SWCNT HP (manufactured by KH Chemicals Co., Ltd., purity 80%) was added to the solution 5-1 as a single-layer carbon nanotube, was ultrasonic-dispersed at 30° C. for 30 minutes using an ultrasonic homogenizer VC-750 (manufactured by Sonics & Materials Inc., taper microchip (having a probe diameter of 6.5 mm) was used, output 50 W, direction radiation, duty ratio 50%), thereby producing a carbon nanotube-dispersed solution 5-1.

Next, 1.17 g of poly(2-vinyl naphthalene) (weight-average molecular weight 175,000, manufactured by Sigma-Aldrich Japan K.K.) was added to the dispersed solution 5-1 as the non-conjugated macromolecule, was dissolved in a 50° C. hot bath, and then was stirred for 15 minutes at a rotation speed of 2200 rpm using a planetary centrifugal mixer ARE-250 (manufactured by Thinky Corporation), thereby producing a carbon nanotube-dispersed paste precursor 5-1.

Furthermore, the precursor 5-1 was reciprocated 15 times under a rotation ratio condition of 1:1.7:2.9 using a triple roll mill BR-100V (manufactured by Aimex Co., Ltd.), thereby preparing carbon nanotube-dispersed paste 5-1.

As a result of actual measurements, the concentration of the solid content in the paste was 4.8 mass %, and the content ratio of the CNT to the solid content was 28.5 mass %.

Example 5-2

Carbon nanotube-dispersed paste 5-2 was produced in the same manner as in Example 5-1 except for the fact that the same amount of the polythiophene 5 (regiorandom) was used instead of the polythiophene 3.

Example 5-3

Carbon nanotube-dispersed paste 5-3 was produced in the same manner as in Example 5-2 except for the fact that the same amount of PC-Z-type polycarbonate (manufactured by Teijin Chemicals Ltd., PANLITE TS-2020) was used instead of poly(2-vinyl naphthalene).

Thermoelectric conversion layers and thermoelectric conversion elements were produced in the same manner as in Example 1-1 except for the fact that the carbon nanotube-dispersed paste 1-1 used in Example 1-1 was changed to the respective pastes produced above, and the characteristics thereof were evaluated. The results are described in Table 5. The concentration of the solid content in Table 5 indicates the concentration of the solid content in the carbon nanotube-dispersed paste.

TABLE 5

|  | Poly-thiophene | Non-conjugated macromolecule | HT bond ratio | Concentration of solid content | Poly-thiophene solubility | CNT-dispersing properties | Film-forming properties | Electric conductivity (S/cm) | PF | Thermo-electric force |
|---|---|---|---|---|---|---|---|---|---|---|
| Example 5-1 | 3 (regio-random) | Poly(2-vinyl-naphthalene) | <90% | 4.8 mass % | 2 | 2 | 1 | 40 | 2.1 | 2.3 |
| Example 5-2 | 5 (regio-random) | Poly(2-vinyl-naphthalene) | 78% | 4.8 mass % | 2 | 1 | 1 | 52 | 2.4 | 2.6 |
| Example 5-3 | 5 (regio-random) | Poly-carbonate | 78% | 4.8 mass % | 1 | 1 | 1 | 48 | 2.2 | 2.1 |

* PF and the thermoelectric forces were evaluated using the relative values with respect to Comparative Example 1-2.

As is evident from Table 5, Examples 5-2 and 5-3 in which regiorandom polythiophene having a branched alkyl group as a side chain was used were particularly excellent in terms of the CNT-dispersing properties.

Example 6-1

A thermoelectric conversion element was produced using a polyethylene terephthalate (hereinafter, PET) film produced below as a substrate.

1. Production of Supporting Body

A PET resin that had been polycondensed using Ge as a catalyst was dried to a water content ratio of 50 ppm or less, the heater temperature was set in a range of 280° C. to 300° C., and the PET resin was molten in an extruder. The molten PET resin was discharged onto an electrostatically-applied chill roll from a die unit, thereby obtaining an amorphous base. The obtained amorphous base was stretched 3.3 times in the base-advancing direction, and then was stretched 3.8 times with respect to the width direction, thereby obtaining a 188 μm-thick supporting body.

2. Formation of Adhesive Layer

After a corona discharge treatment was carried out on both surfaces of the obtained supporting body under a condition of 730 J/m², a coating fluid A for an adhesive layer having the following composition was applied to both surfaces using a bar coating method at an application amount of 4.4 cm³/m². In addition, the coating fluid-applied surfaces were dried at 160° C. for one minute so as to form an adhesive layer, thereby obtaining a laminate sheet (conductor) including the adhesive layer formed on both surfaces of the supporting body.

—Composition of Coating Fluid a for Adhesive Layer—

| | |
|---|---|
| Urethane resin binder (manufactured by Mitsui Chemicals, Inc., OLESTER UD350, solid content of 38 mass %, glass transition temperature of 33° C.) | 30.7 parts by mass |
| Acryl resin binder (manufactured by Daicel FineChem Ltd., AS563, solid content of 27.5 mass %, glass transition temperature of 47° C.) | 4.2 parts by mass |
| Crosslinking agent (manufactured by Nisshinbo Holdings Inc., CARBODILITE V-02-L2, solid content of 40 mass %) | 5.8 parts by mass |
| Additive (filler) (manufactured by Nippon Aerosil Co., Ltd., AEROSIL OX-50, solid content of 10 mass %) | 1.9 parts by mass |
| Additive (filler) (manufactured by Nissan Chemical Industries, Ltd., SNOTEX XL, solid content of 40 mass %) | 0.8 parts by mass |
| Additive (sliding agent) (manufactured by Chukyo Yushi Co, Ltd SELOSOL 524, solid content of 30 mass %) | 1.9 parts by mass |
| Surfactant 1 (manufactured by NOF Corporation, RAPISOL B-90, anionic 1 mass %) | 15.5 parts by mass |
| Surfactant 2 (manufactured by Sanyo Chemical Industries, Ltd., NARO ACTY CL-95, nonionic 1 mass %) | 19.4 parts by mass |
| Pure water added so that the total reached | 1000 parts by mass |

3. Production of Carbon Nanotube-Dispersed Paste

Carbon nanotube-dispersed paste 6-1 was produced in the same manner as in Example 5-1 except for the fact that the same amount of polystyrene having a polymerization degree of 2,000 (manufactured by Wako Pure Chemical Industries, Ltd.) was used instead of poly(2-vinyl naphthalene).

4. Production of Thermoelectric Conversion Element

A 100 nm-thick chromium layer and then a 200 nm-thick gold layer were laminated through an ion plating method on a 40 mm×50 mm laminate sheet using a metal mask having a 20 mm×20 mm opening section formed by etching, thereby forming an electrode 1.

Next, the above-prepared carbon nanotube-dispersed paste 6-1 was injected using the 2 mm-thick metal mask having a 13 mm×13 mm opening section formed by a laser process, and then the film substrate was heated and dried on an 80° C. hot plate, thereby producing a thermoelectric conversion layer 6-1 on the electrode 1.

Next, a conductive paste DOTITE D-550 (manufactured by Fujikura Kasei Co., Ltd., silver paste) was applied using a screen printing method so as to form an electrode 2 on the thermoelectric conversion layer 6-1, thereby producing a thermoelectric conversion element 6-1.

As a result of measuring the voltage difference caused between the electrode 1 and the electrode 2 when the film substrate in the thermoelectric conversion element was heated on the hot plate having a surface temperature of 80° C. using a digital multi-meter R6581 (manufactured by Advantest Corporation), it was confirmed that a voltage difference was caused.

Example 6-2

Carbon nanotube-dispersed paste 6-2 was produced in the same manner as in Example 6-1 except for the fact that the same amount of polythiophene 5 (regionrandom) was used instead of the polythiophene 3. Subsequently, a thermoelectric conversion element 6-2 was produced in the same manner as in Example 6-1 except for the fact that the carbon nanotube-dispersed paste 6-2 was used instead of the carbon nanotube-dispersed paste 6-1.

As a result of measuring the voltage difference caused between the electrode 1 and the electrode 2 when the film substrate in the thermoelectric conversion element was heated on the hot plate having a surface temperature of 80° C. using a digital multi-meter R6581 (manufactured by Advantest Corporation), it was confirmed that a voltage difference was caused.

What is claimed is:

1. A thermoelectric conversion element comprising a thermoelectric conversion layer formed by using a thermoelectric conversion material,
   wherein the thermoelectric conversion material includes;
   a polythiophene polymer, which includes a main chain made of a repeating unit represented by the following formula (I), and has a side chain R in a regiorandom array with respect to the main chain,
   a carbon nanotube, and
   a non-conjugated macromolecule,

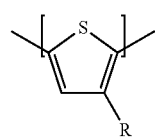

Formula (1)

in Formula (1), R represents an alkyl group having 1 to 20 carbon atoms.

2. The thermoelectric conversion element according to claim 1,
   wherein a proportion of head to tail bonds in the polythiophene polymer is less than 95%.

3. The thermoelectric conversion element according to claim 1,
   wherein, in Formula (1), R represents an alkyl group having 4 to 12 carbon atoms.

4. The thermoelectric conversion element according to claim 1,
   wherein, in Formula (1), R represents a branched alkyl group.

5. The thermoelectric conversion element according to claim 1,
wherein, in Formula (1), R represents a 2-ethyl hexyl group.

6. The thermoelectric conversion element according to claim 1,
wherein a concentration of metal impurities containing in the polythiophene polymer is 1000 ppm or less, and
the metal impurities contain at least one metal selected from Fe, Zn, and Ni.

7. The thermoelectric conversion element according to claim 1,
wherein, in a total solid content of the thermoelectric conversion material, a content of the carbon nanotube is in a range of 10 mass % to 60 mass %, and a content ratio between the polythiophene polymer and the carbon nanotube is in a range of 1:4 to 4:1.

8. The thermoelectric conversion element according to claim 1 further comprising:
a base material; and
a pair of electrodes on the base material,
wherein the thermoelectric conversion layer is disposed between the electrodes.

9. A thermoelectric conversion material comprising:
a polythiophene polymer, which includes a main chain made of a repeating unit represented by the following formula (I), and has a side chain R in a regiorandom array with respect to the main chain, a carbon nanotube, and a non-conjugated macromolecule,

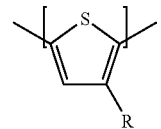

Formula (1)

in Formula (1), R represents an alkyl group having 1 to 20 carbon atoms.

10. The thermoelectric conversion material according to claim 9, further comprising:
a solvent.

* * * * *